(12) United States Patent
Zhou

(10) Patent No.: US 11,682,725 B2
(45) Date of Patent: Jun. 20, 2023

(54) SEMICONDUCTOR DEVICE WITH ISOLATION LAYER

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 65 days.

(21) Appl. No.: 17/450,200

(22) Filed: Oct. 7, 2021

(65) Prior Publication Data
US 2022/0029014 A1 Jan. 27, 2022

Related U.S. Application Data

(62) Division of application No. 16/572,882, filed on Sep. 17, 2019, now Pat. No. 11,205,721.

(30) Foreign Application Priority Data

Oct. 31, 2018 (CN) .......................... 201811287076.1

(51) Int. Cl.
*H01L 29/78* (2006.01)
*H01L 29/06* (2006.01)
*H01L 29/66* (2006.01)
*H01L 21/266* (2006.01)
*H01L 21/3213* (2006.01)
*H01L 21/02* (2006.01)

(52) U.S. Cl.
CPC .... *H01L 29/7816* (2013.01); *H01L 21/02573* (2013.01); *H01L 21/266* (2013.01); *H01L 21/32136* (2013.01); *H01L 21/32139* (2013.01); *H01L 29/0653* (2013.01); *H01L 29/66545* (2013.01); *H01L 29/66689* (2013.01); *H01L 29/66696* (2013.01); *H01L 29/66795* (2013.01); *H01L 29/7851* (2013.01)

(58) Field of Classification Search
CPC combination set(s) only.
See application file for complete search history.

(56) References Cited

U.S. PATENT DOCUMENTS

| 10,573,744 | B1 * | 2/2020 | Zuniga | ............... H01L 21/266 |
| 2017/0365603 | A1 * | 12/2017 | Zhou | ................ H01L 27/0924 |
| 2020/0135917 | A1 | 4/2020 | Singh et al. | |

FOREIGN PATENT DOCUMENTS

EP  3258499 A1  12/2017

* cited by examiner

*Primary Examiner* — Suberr L Chi
(74) *Attorney, Agent, or Firm* — Anova Law Group, PLLC

(57) ABSTRACT

A semiconductor device is provided. The semiconductor device includes a base substrate; a first well region and a second well region in the base substrate; a gate electrode structure, sidewall spacers, a doped source layer and a doped drain layer over the base substrate; a dielectric layer on the base substrate; and an isolation layer in the dielectric layer. The dielectric layer covers sidewalls of the sidewall spacers, the doped source layer and the doped drain layer, and exposes a top surface of the gate electrode structure. The isolation layer is in the gate electrode structure of the second well region and the base substrate of the second well region, and adjacent to the sidewalls of the sidewall spacer over the second well region.

9 Claims, 5 Drawing Sheets

SEMICONDUCTOR DEVICE WITH ISOLATION LAYER

CROSS-REFERENCE TO RELATED APPLICATION

This application is a application of U.S. patent application Ser. No. 16/572,882, filed on Sep. 17, 2019, which claims the priority of Chinese Patent Application No. 201811287076.1, filed on Oct. 31, 2018, the content of which is incorporated herein by reference in its entirety.

TECHNICAL FIELD

The present disclosure generally relates to the field of semiconductor manufacturing and, more particularly, relates to a semiconductor device and its fabrication method.

BACKGROUND

With the rapid development of semiconductor technology, the semiconductor devices present a development trend of high element density and high integration. Currently, the semiconductor devices, as the most basic devices, are widely used. The conventional planar devices have weak control on channel current, which may cause the short-channel effect and leakage current, thereby ultimately affecting the electrical performance of the semiconductor devices.

In order to improve the device withstanding voltage, the laterally diffused metal oxide semiconductor (LDMOS) is used in the conventional technology. The structure of the laterally diffused metal oxide semiconductor may include: a first well region and a second well region in a substrate, and a gate electrode structure over the first well region and the second well region, where a conductivity type of the first well region is different from a conductivity type of the second well region; and a doped source layer and a doped drain layer in the substrate on two sides of the gate electrode structure, where the doped drain layer is in the second well region and the doped source layer is in the first well region; the doped source layer and the doped drain layer have source/drain ions; and a conductivity type of the source/drain ions is the same as a conductivity type of the first well region.

However, there is a need to provide semiconductor devices and fabrication methods with improved device performance.

SUMMARY

One aspect of the present disclosure provides a method for fabricating a semiconductor device. The method includes providing a base substrate; forming a first well region and a second well region in the base substrate, where a conductivity type of the first well region is opposite to a conductivity type of the second well region; forming a gate electrode structure, sidewall spacers, a doped source layer, a doped drain layer and a dielectric layer over the base substrate, where the sidewall spacers cover sidewalls of the gate electrode structure; the doped source layer and the doped drain layer are respectively on two sides of the gate electrode structure and the sidewall spacers; the gate electrode structure and the sidewall spacers are over the first well region and the second well region; the doped source layer is in the first well region and the doped drain layer is in the second well region; a conductivity type of each of the doped source layer and the doped drain layer is opposite to the conductivity type of the second well region; and the dielectric layer covers sidewalls of the sidewall spacers, top surfaces and sidewalls of the doped source layer and the doped drain layer, and exposes a top surface of the gate electrode structure; after forming the gate electrode structure and the dielectric layer, removing a portion of the gate electrode structure on the second well region and a portion of the base substrate of the second well region to form a trench in the dielectric layer, where a minimum distance between a sidewall of the trench and the first well region is greater than zero, and the trench exposes a portion of the sidewall spacers; and forming an isolation layer in the trench.

Another aspect of the present disclosure includes a semiconductor device fabricated by embodiments of the present disclosure. The semiconductor device includes a base substrate; a first well region and a second well region in the base substrate, where a conductivity type of the first well region is opposite to a conductivity type of the second well region; a gate electrode structure, sidewall spacers, a doped source layer and a doped drain layer over the base substrate, where the sidewall spacers cover sidewalls of the gate electrode structure; the doped source layer and the doped drain layer are respectively on two sides of the gate electrode structure and the sidewall spacers; the gate electrode structure and the sidewall spacers are on the first well region and the second well region; the doped source layer is in the first well region and the doped drain layer is in the second well region; and a conductivity type of the doped source layer and the doped drain layer is opposite to a conductivity type of the second well region; a dielectric layer on the base substrate, where the dielectric layer covers sidewalls of the sidewall spacers, the doped source layer and the doped drain layer, and exposes a top surface of the gate electrode structure; and an isolation layer in the dielectric layer, where the isolation layer is in the gate electrode structure of the second well region and the base substrate of the second well region, and adjacent to the sidewalls of the sidewall spacer over the second well region.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Semiconductor device and fabrication method are provided. The method includes: providing a base substrate; forming a first well region and a second well region the base substrate, where a conductivity type of the first well region is opposite to a conductivity type of the second well region; forming a gate electrode structure, sidewall spacers, a doped source layer, a doped drain layer and a dielectric layer over the base substrate; after forming the gate electrode structure and the dielectric layer, removing a portion of the gate electrode structure on the second well region and a portion of the base substrate of the second well region to form a trench in the dielectric layer, where a minimum distance between a sidewall of the trench and the first well region is greater than zero, and the trench exposes a portion of the sidewall spacers; and forming an isolation layer in the trench. The sidewall spacers cover sidewalls of the gate electrode structure; the doped source layer and the doped drain layer are respectively on two sides of the gate electrode structure and the sidewall spacers; the gate electrode structure and the sidewall spacers are over the first well region and the second well region; the doped source layer is in the first well region and the doped drain layer is in the second well region; a conductivity type of each of the doped source layer and the doped drain layer is opposite to the conductivity type of the second well region; and the dielectric layer covers sidewalls of the sidewall spacers, top surfaces and sidewalls of the doped source layer and the doped drain layer and exposes a top surface of the gate electrode structure. The method may reduce the volume of the semiconductor device.

Figure 1:
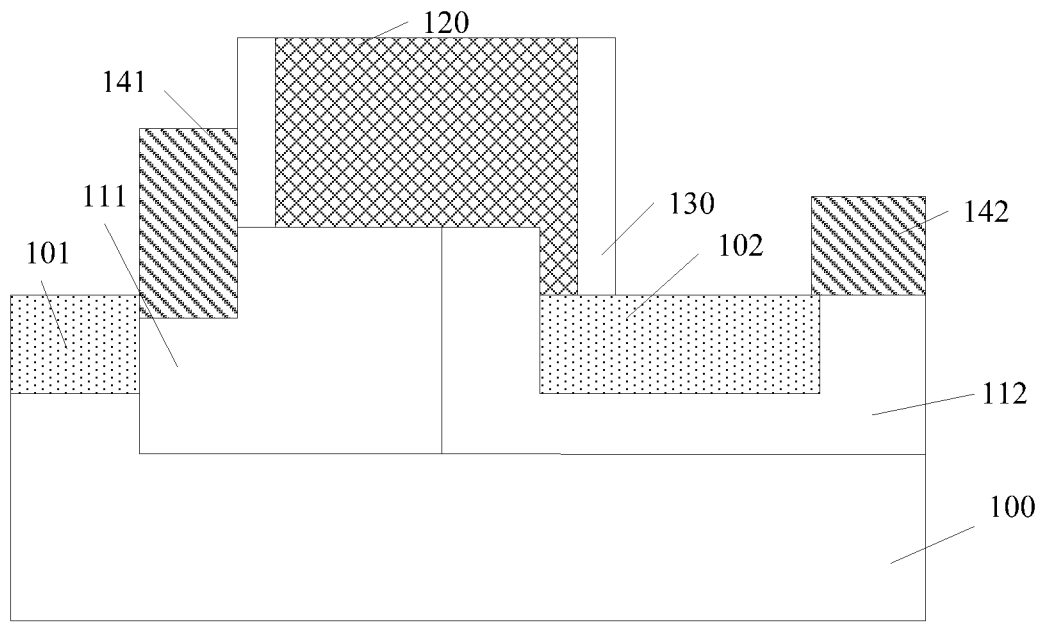
FIG. 1 illustrates a structural schematic corresponding to a semiconductor device.

Referring to FIG. 1, FIG. 1 illustrates a structural schematic corresponding to a semiconductor device. The semiconductor device may include: a base substrate including a semiconductor substrate 100, a fin on the semiconductor substrate 100, and an isolation region 101 on the semiconductor substrate 100, where a first well region 111 and a second well region 112 may be in the fin and the semiconductor substrate 100, the first well region 111 may be adjacent to the second well region 112, a conductivity type of the first well region 111 may be opposite to a conductivity type of the second well region 112, and an isolation drift region 102 may be in the second well region 112; a gate electrode structure 120 on the base substrate, where the gate electrode structure may cover a portion of sidewalls and a top of the fin and may be on the first well region 111 and the second well region 112; sidewall spacers 130 on sidewalls of the gate electrode structure 120; a doped source layer 141 and a doped drain layer 142 in the fin on two sides of the gate electrode structure and the sidewall spacers. The doped source layer 141 may be in the first well region 111, and the doped drain well region 142 may be in the second well region 112. A conductivity type of the doped source layer 141 and the doped drain layer 142 may be opposite to the conductivity type of the second well region 112. The isolation drift region 102 may be between the doped drain layer 142 and the gate electrode structure 120.

In the above-mentioned semiconductor device, the doped drain layer 142 may be in the second well region 112 and the isolation drift region 102 may be in the second well region 112, and also the isolation drift region 102 may be between the gate electrode structure 120 and the doped drain layer 142. Therefore, the carrier path of the doped drain layer 142 to the gate electrode structure 120 may need to bypass the isolation drift region 102. When a drain voltage is applied to the doped drain layer 142, the path of carriers generated by the drain voltage from the second well region 112 to the gate electrode structure 120 may be longer. The longer the path is, the more the neutralized carriers generated by the drain voltage are, so the number of the carriers from the drain reaching the gate electrode structure 120 may be reduced, and the potential generated by the carriers from the drain may be reduced, thereby implementing the voltage division of the drain voltage. The isolation drift region 102 may be between the gate electrode structure 120 and the doped drain layer 142, so the formed semiconductor device may have a large volume, which may not meet the trend of device miniaturization.

In the present disclosure, a trench may be formed by etching a gate electrode structure and a base substrate. An isolation layer may be formed in the trench and may isolate a doped drain layer and the gate electrode structure. In such way, when a drain voltage is applied to the doped drain layer, carriers generated by the drain voltage may need to bypass the isolation layer to reach the gate electrode structure, and the path of the carriers from the drain may be longer, thereby implementing the voltage division. The isolation layer may be formed by an etching and filling process, which may make the isolation layer to have a large thickness and have a better voltage division effect. Furthermore, the isolation layer may be in the gate electrode structure and occupy a small area, so the formed semiconductor device may have a relatively small volume and meet the trend of semiconductor device miniaturization.

In order to further illustrate the above described objects, features, and advantages of the present disclosure, various specific embodiments of the present disclosure will be described in detail below with reference to the accompanying drawings.

FIGS. 2-9 illustrate structural schematics corresponding to certain stages for forming an exemplary semiconductor device according to various disclosed embodiments of the present disclosure. FIG. 10 illustrates a flowchart of an exemplary fabrication method for forming a semiconductor structure according to various disclosed embodiments of the present disclosure.

Figure 2:
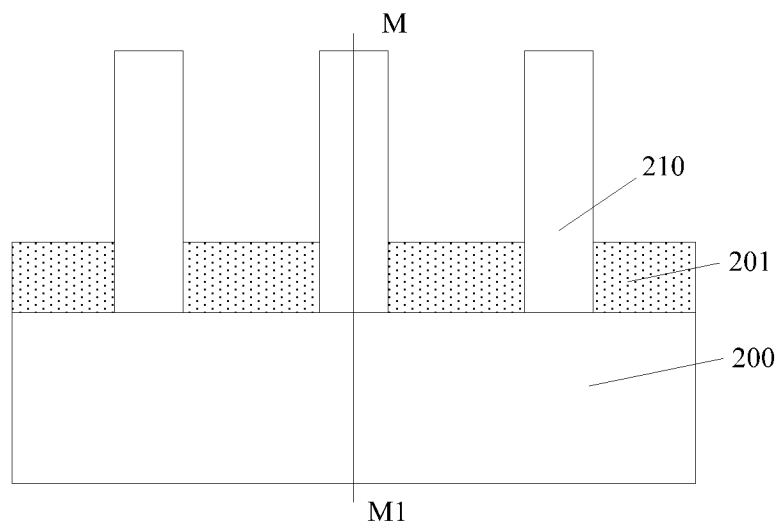
FIGS. 2-9 illustrate structural schematics corresponding to certain stages for forming an exemplary semiconductor device according to various disclosed embodiments of the present disclosure.

Referring to FIG. 2, a base substrate may be provided (e.g., in S401 of FIG. 10).

In one embodiment, the base substrate may include a semiconductor substrate 200 and a fin 210 on the semiconductor substrate 200.

In other embodiments, the base substrate may be a planar semiconductor substrate.

In one embodiment, the material of the semiconductor substrate 200 may be single crystal silicon. The semiconductor substrate 200 may also be made of a material including polycrystalline silicon or amorphous silicon. The semiconductor substrate 200 may also be made of a material including germanium, silicon germanium or gallium arsenide, and any other suitable semiconductor materials.

In one embodiment, the fin 210 may be formed by patterning the semiconductor substrate 200. In other embodiments, the formation of the fin 210 may include forming a fin material layer on the semiconductor substrate and then forming the fin 210 by patterning the fin material layer.

In one embodiment, the fin 210 may be made of monocrystalline silicon. In other embodiments, the fin may be made of a material including monocrystalline germanium silicon or other suitable materials. A number of the fin 210 may be one or more.

In one embodiment, the method may further include forming an isolation structure 201 on the semiconductor substrate 200, where the isolation structure 201 may cover a portion of sidewalls of the fin 210. The isolation structure 201 may be made of a material including silicon oxide.

Figure 3:
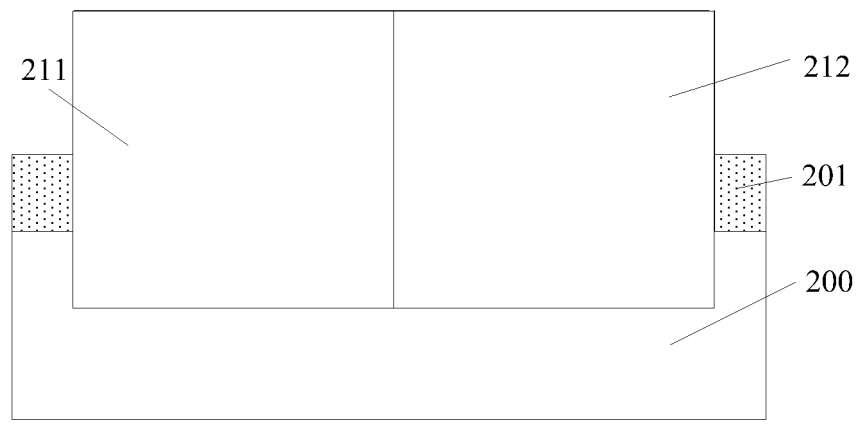

Referring to FIG. 3, FIG. 3 illustrates a cross-sectional view along a M-M1 line in FIG. 2. A first well region 211 and a second well region 212 may be formed in the base substrate. A conductivity type of the first well region 211 may be opposite to a conductivity type of the second well region 212 (e.g., in S402 of FIG. 10).

First ions may be in the first well region 211 and second ions may be in the second well region 212. A conductivity type of the first ions may be opposite to a conductivity type of the second ions.

In one embodiment, the first well region 211 may be adjacent to the second well region 212.

In other embodiments, a deep doped region may be between the first well region 211 and the second well region 212.

The conductivity type of the second well region 212 may be different from the conductivity type of the first well region 211. The second well region 212 may be connected to a doped drain layer formed subsequently, and the conductivity type of the second well region 212 may be opposite to a conductivity type of the doped drain layer. When applying a voltage to the drain, the second well region 212 may function as a voltage division, so the voltage reaching the first well region 211 may be reduced.

The method for forming the first well region 211 and the second well region 212 may include: forming a first pattern layer (not shown) on the base substrate, where the first pattern layer may expose a portion of a base substrate surface; using the first pattern layer as a mask, performing a first ion implantation in the base substrate where the first implanted ions may be first ions, and forming the first well region 211 in the base substrate; removing the first pattern layer to form a second pattern layer on the base substrate, where the second pattern layer may cover a surface of the first well region 211 and expose a portion of the base substrate surface; and using the second pattern layer as a mask, performing a second ion implantation in the base substrate where the second implanted ions may be second ions, and forming the second well region 212 in the base substrate.

In one embodiment, the first well region 211 and the second well region 212 may be formed in the fin 210 and the semiconductor substrate 200.

The method for forming the first well region 211 and the second well region 212 may include: forming the first pattern layer (not shown) on the fin 210 and the isolation structure 201, where the first pattern layer may expose a portion of the surface of the fin 210; using the first pattern layer as a mask, performing the first ion implantation in the fin 210 and the semiconductor substrate 200 where the first implanted ions may be the first ions, and forming the first well region 211 in the fin 210 and the semiconductor substrate 200; removing the first pattern layer to form the second pattern layer (not shown) on the fin 210 and the isolation structure 201, where the second pattern layer may cover the surface of the first well region 211 and expose the portion of the surface of the fin 210; and using the second pattern layer as the mask, performing the second ion implantation in the fin 210 and the semiconductor substrate 200 where the second implanted ions may be the second ions, and forming the second well region 212 in the fin 210 and the semiconductor substrate 200.

Depths of the first well region 211 and the second well region 212 may be controlled by adjusting parameters of the first ion implantation and the second ion implantation.

In one embodiment, the first well region 211 and the second well region 212 may be formed only in the fin 210.

A gate electrode structure may be subsequently formed on the fin 210, and the gate electrode structure may be on the first well region 211 and the second well region 212.

When the gate electrode structure is used to form a P-type device, the conductivity type of the first ions may be N-type, and the first ions may include phosphorus ions, arsenic ions or antimony ions; the conductivity type of the second ions may be P-type, and the second ions may include boron ions, $Br^{2-}$ ions or indium ions.

When the gate electrode structure is used to form a N-type device, the conductivity type of the first ions may be P-type, and the first ions may include boron ions, $Br^{2-}$ ions or indium ions; the conductivity type of the second ions may be N-type, and the second ions may include phosphorus ions, arsenic ions or antimony ions.

The gate electrode structure, the sidewall spacers, the doped source layer, the doped drain layer and the dielectric layer may be formed over the base substrate (e.g., in S403 of FIG. 10). The sidewall spacers may cover sidewalls of the gate electrode structure. The doped source layer and the doped drain layer may be respectively on two sides of the gate electrode structure and the sidewall spacers. The gate electrode structure and the sidewall spacers may be over the first well region and the second well region. The doped source layer may be in the first well region and the doped drain layer may be in the second well region. The doped source layer and the doped drain layer may have source/drain ions. The conductivity type of the source/drain ions may be opposite to the conductivity type of the second ions. The dielectric layer may cover sidewalls of the sidewall spacers, tops and sidewalls of the doped source layer and the doped drain layer, and may expose the top surface of the gate electrode structure. Refer to FIG. 4 to FIG. 7 for details.

Figure 4:
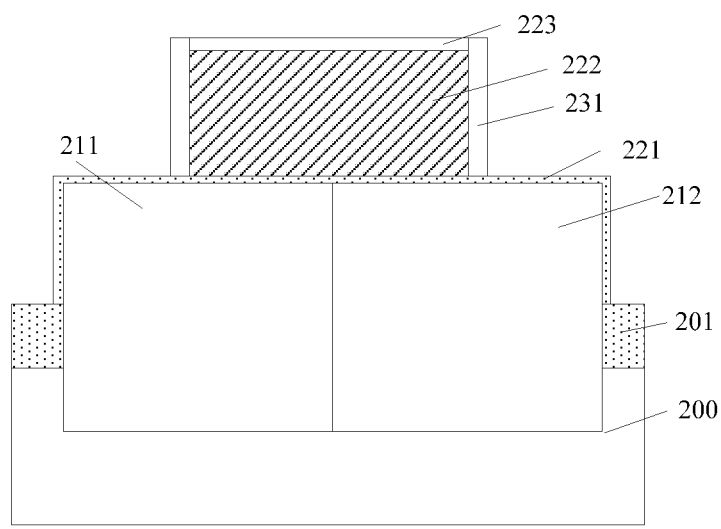

Referrering to FIG. 4, a dummy gate electrode structure acrossing the fin 210 may be formed. The dummy gate electrode structure may cover a portion of the top surface and a portion of the sidewall surfaces of the fin 210. The dummy gate electrode structure may be on the first well region 211 and the second well region 212. Sidewall spacers 231 may be formed on sidewalls of the dummy gate electrode structure.

In one embodiment, the dummy gate electrode structure may include a dummy gate dielectric layer 221, a dummy gate electrode layer 222 on the dummy gate dielectric layer 221, and a dummy gate protection layer 223 on a top surface of the dummy gate electrode layer 222.

The dummy gate dielectric layer 221 may cover the sidewalls and the top surface of the fin 210. The dummy gate dielectric layer may be made of a material including silicon oxide.

The method for forming the dummy gate electrode layer 222 may include: forming a dummy gate electrode film (not shown) on the surface of the dummy gate dielectric layer 221; forming a mask layer on the dummy gate electrode film, where the mask layer may expose a portion of a surface of the dummy gate electrode film; using the mask layer as a mask, etching the dummy gate electrode film to form the dummy gate electrode layer on the dummy gate dielectric layer 221.

The dummy gate electrode layer 222 may be made of a material including polycrystalline silicon.

The dummy gate protection layer 223 may be made of a material including silicon oxide or silicon nitride.

The sidewall spacers 231 may be on the dummy gate dielectric layer 221, and may be respectively on the first well region 211 and the second well region 212.

The sidewall spacers 231 may include first sidewall spacers and second sidewall spacers. The first sidewall spacers may be adjacent to the sidewalls of the dummy gate electrode structure, and the second sidewall spacers may be adjacent to sidewalls of the first sidewall spacers.

The first sidewall spacers may be on two sides of the dummy gate electrode structure and cover the sidewall surfaces of the dummy gate electrode structure.

The first sidewall spacers may protect the dummy gate electrode structure during the formation of a lightly doped region by ion implantation, and may define a position of the lightly doped region.

The forming process of the first sidewall spacers may include: forming a first sidewall spacer material layer on the isolation structure 201, the fin 210 and the dummy gate electrode structure; and etching back the first sidewall spacer material layer till exposing the top surfaces of the dummy gate dielectric layer 221 and the dummy gate protection layer 223 on the fin 210, and forming the first sidewall spacers, which may cover the sidewalls of the dummy gate electrode structure, on the fin 210, where the first sidewall spacers may be on the dummy gate dielectric layer 221.

The forming process of the first sidewall spacer material layer may be one or a combination of a chemical vapor deposition process, a physical vapor deposition process or an atomic layer deposition process. The first sidewall spacers may be made of a material including silicon oxide, silicon nitride, silicon oxynitride, silicon oxycarbide, silicon carbonitride or silicon oxycarbonitride.

The second sidewall spacers may be on two sides of the dummy gate electrode structure and the first sidewall spacers, and may cover sidewall surfaces of the first sidewall spacers.

The second sidewall spacers may define a position of the doped source/drain layer.

The forming process of the second sidewall spacers may include: forming a second sidewall spacer material layer on the isolation structure 201, the fin 210, the dummy gate electrode structure and the first sidewall spacers; and etching back the second sidewall spacer material layer till exposing the top surfaces of the dummy gate dielectric layer 221 and the dummy gate protection layer 223 on the fin 210, and forming the second sidewall spacers, which may cover the sidewalls of the first sidewall spacers, on the fin 210, where the second sidewall spacers may be on the dummy gate dielectric layer 221.

The forming process of the second sidewall spacer material layer may be one or a combination of a chemical vapor deposition process, a physical vapor deposition process or an atomic layer deposition process. The second sidewall spacers may be made of a material including silicon oxide, silicon nitride, silicon oxynitride, silicon oxycarbide, silicon carbonitride or silicon oxycarbonitride.

The first sidewall spacers and second sidewall spacers may define the distance between the the gate electrode structure and the doped source/drain layer, which may be formed subsequently.

Figure 5:
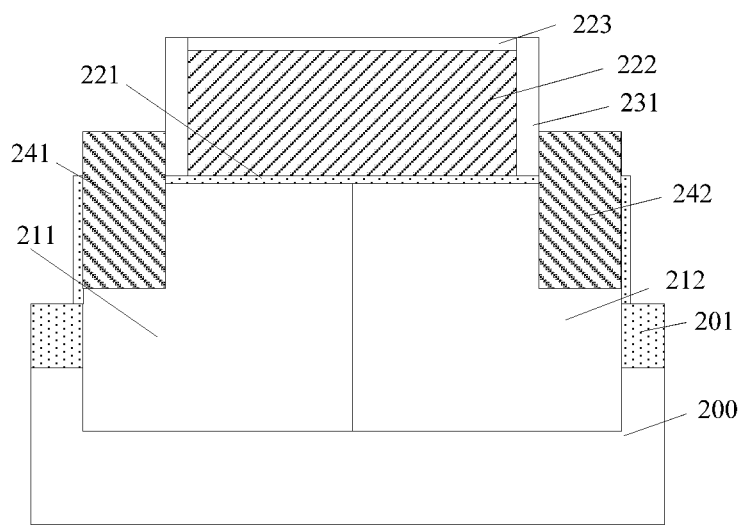

Referring to FIG. 5, after forming the sidewall spacers 231, a doped source layer 241 and a doped drain layer 242 may be formed in the base substrate on two sides of the dummy gate electrode structure and the sidewall spacers 231. The doped source layer 241 may be in the first well region 211, and the doped drain layer 242 may be in the second well region 212.

The method for forming the doped source layer 241 and the doped drain layer 242 may include: forming a source/drain trench (not shown) in the base substrate on two sides of the dummy gate electrode structure and the sidewall spacers 231; and respectively forming the doped source layer 241 and the doped drain layer 242 in the source/drain trench epitaxially.

In one embodiment, the doped source layer 241 and the doped drain layer 242 may be formed in the fin 210 on two sides of the dummy gate electrode structure and the sidewall spacers 231.

The doped source layer 241 and the doped drain layer 242 may have the source/drain ions.

When epitaxially forming the doped source layer 241 and the doped drain layer 242 in the source/drain trench respectively, the doped source layer 241 and the doped drain layer 242 may be doped in situ. The source/drain ions may be doped in the doped source layer 241 and the doped drain layer 242. The conductivity type of the source/drain ions may be the same as the conductivity type of the first ions.

When the gate electrode structure is used to form a P-type device, the doped source layer 241 and the doped drain layer 242 may be made of a material including silicon, germanium and silicon germanium. The conductivity type of the source/drain ions may be P-type, and the source/drain ions may include boron ions, $Br^{2-}$ ions or indium ions.

When the gate electrode structure is used to form a N-type device, the doped source layer 241 and the doped drain layer 242 may be made of a material including silicon, gallium arsenide or indium gallium arsenide. The conductivity type of the source/drain ions may be N-type, and the source/drain ions may include phosphorus ions, arsenic ions or antimony ions.

In one embodiment, the gate electrode structure may be used to form a N-type device. The first well region may be a P-well and the second well region may be a N-well. The first ions may be boron ions, the second ions may phosphorus ions and the source/drain ions may be boron ions.

The doped source layer 241 and the doped drain layer 242 may be made of a material including silicon germanium doped with boron ions.

In one embodiment, the gate electrode structure may be used to form a P-type device. The first well region may be a N-well and the second well region may be a P-well. The first ions may be phosphorus ions, the second ions may boron ions and the source/drain ions may be phosphorus ions.

The doped source layer 241 and the doped drain layer 242 may be made of a material including silicon doped with phosphorus ions.

The conductivity type of the doped drain layer 242 may be opposite to the conductivity type of the second well region 212. In such way, when a drain voltage is applied to the doped drain layer, a carrier type generated by the drain voltage may be opposite to a carrier type in the second well region 212. Therefore, a neutralization reaction may occur and the carrier number from the drain of the gate electrode structure may be reduced, thereby implementing the voltage division. When a withstanding voltage of the gate electrode structure is constant, the drain may withstand a higher voltage, so the withstanding voltage of the semiconductor device may be increased, and the performance of the semiconductor device may be improved.

Figure 6:
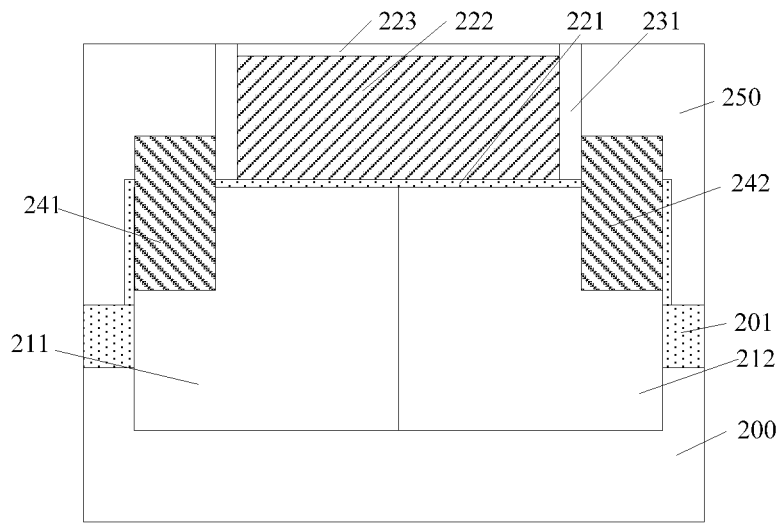

Referring to FIG. 6, after forming the doped source layer 241 and the doped drain layer 242, a dielectric layer 250 may be formed on the base substrate. The dielectric layer 250 may cover the sidewalls of the sidewall spacers 231, and the tops and sidewalls of the doped source layer 241 and the doped drain layer 242, and may expose the top surface of the dummy gate protection layer 223 of the dummy gate electrode structure.

The method for forming the dielectric layer 250 may include: forming an initial dielectric layer (not shown) on the isolation structure 201, the dummy gate electrode structure, the doped source layer 241 and the doped drain layer 242; and planarizing the initial dielectric layer till exposing the top surface of the dummy gate protection layer 223 of the dummy gate electrode structure to form the dielectric layer 250.

The dielectric layer 250 may be made of a material including silicon oxide, silicon nitride, silicon oxynitride, silicon oxycarbide, silicon carbonitride or silicon oxycarbonitride.

In one embodiment, the material of the dielectric layer may be silicon oxide.

The initial dielectric layer may be formed by a deposition process such as a fluid chemical vapor deposition process. The fluid chemical vapor deposition process may be used to form the initial dielectric layer, which may make the initial dielectric layer to have better filling performance.

Figure 7:
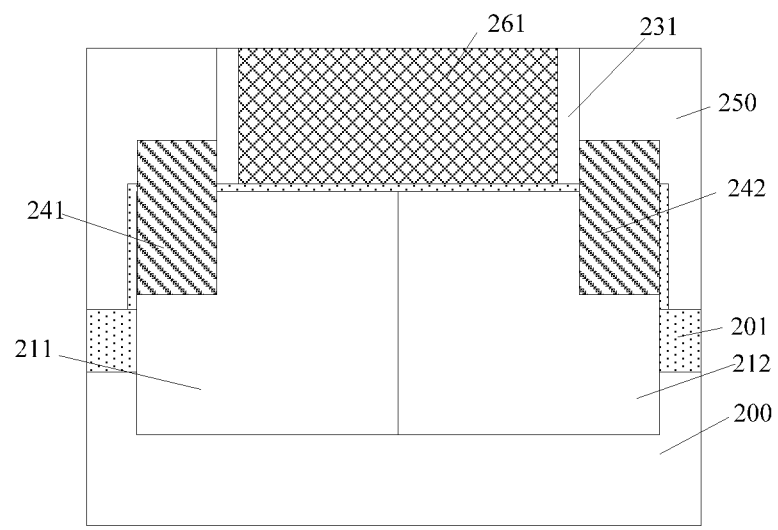

Referring to FIG. 7, after forming the dielectric layer 250, the dummy gate electrode structure may be removed to form a gate opening in the dielectric layer 250. A gate electrode structure 261 may be formed in the gate opening.

The gate electrode structure 261 may include a gate dielectric layer and a gate electrode layer on the gate dielectric layer.

The gate electrode structure 261 may further include an interface layer (not shown) covering a bottom of the gate opening, where the gate dielectric layer may cover the interface layer.

The interface layer may be made of a material including silicon oxide. The interface layer may be formed by a process including an oxidation process. The function of the interface layer may include repairing surface defects of the fin 210 at the bottom of the gate opening.

The interface layer may be made of a material including silicon oxide or silicon oxynitride.

In one embodiment, the interface layer may be made of silicon oxide.

The gate dielectric layer may be made of a high-k dielectric material (dielectric coefficient greater than 3.9). The high-k dielectric material may include hafnium oxide, zirconium oxide, hafnium silicon oxide, lanthanum oxide, titanium oxide, tantalum oxide, titanium strontium barium oxide, titanium barium oxide, titanium strontium oxide or aluminum oxide.

In one embodiment, the material of the gate dielectric layer may be hafnium oxide.

The gate dielectric layer may be formed by a process including a chemical vapor deposition process, a physical vapor deposition process or an atomic layer deposition process.

The material of the gate electrode layer may be a metal, and the metal material may include one or a combination of copper, tungsten, nickel, chromium, titanium, tantalum, and aluminum.

In one embodiment, the material of the gate electrode layer may be tungsten.

In one embodiment, the method for forming the gate electrode structure, the sidewall spacers, the doped source layer, the doped drain layer and the dielectric layer may include: forming the gate electrode structure on the base substrate, where the gate electrode structure may be on the first well region and the second well region; forming the sidewall spacers on the sidewalls of the gate electrode structure; forming the doped source layer and the doped drain layer in the base substrate on two sides of the sidewall spacers and the gate electrode structure; after forming the doped source layer and the doped drain layer, forming the dielectric layer on the base substrate, where the dielectric layer may cover the sidewalls of the sidewall spacers, the tops and sidewalls of the doped source layer and the doped drain layer, and also expose the top surface of the gate electrode structure.

Figure 8:
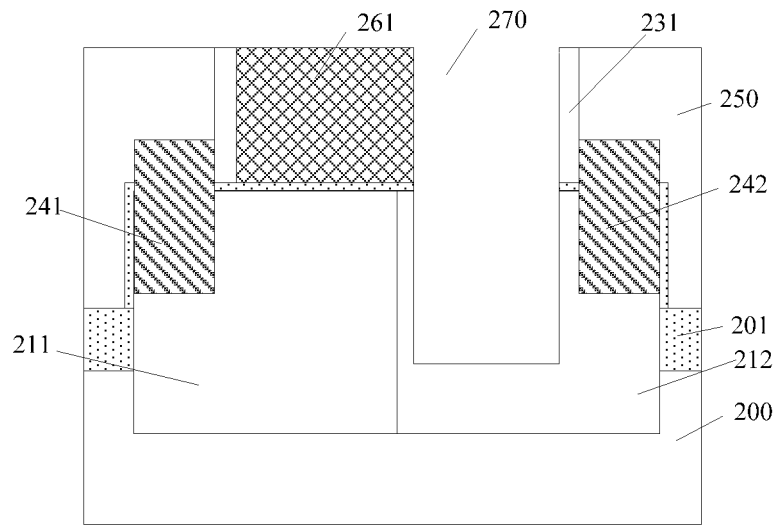

Referring to FIG. 8, after forming the gate electrode structure 261 and the dielectric layer 250, a portion of the gate electrode structure 261 on the second well region 212 and a portion of the base substrate of the second well region 212 may be removed to form a trench 270 in the dielectric layer 250 (e.g., in S404 of FIG. 10). A minimum distance between the sidewall of the trench 270 and the first well region 211 may be greater than zero, and the trench 270 may expose the sidewalls of the sidewall spacers on the second well region 212.

The method for forming the trench 270 may include: forming a mask layer (not shown) on the gate electrode structure 261 and the dielectric layer 250, where the mask layer may expose a portion of the surface of the gate electrode structure 261 on the second well region 212; using the mask layer as a mask, etching the gate electrode structure 261 and the base substrate of the second well region 212 to form the trench 270 in the dielectric layer 250.

In one embodiment, the portion of the gate electrode structure 261 on the second well region 212 and a portion of the fin 210 in the second well region 212 may be removed to form the trench 270 in the dielectric layer 250.

The process for removing the portion of the gate electrode structure on the second well region and the portion of the fin in the second well region may include an anisotropic dry etching process.

In one embodiment, the parameters of the dry etching process may include: applied gases including $CF_4$, $SF_6$ and $Cl_2$, a flow rate of $CF_4$ of about 10 sccm to about 500 sccm, a flow rate of $SF_6$ of about 20 sccm to about 300 sccm, a flow rate of $Cl_2$ of about 6 sccm to about 120 sccm, a chamber pressure of about 1 mtorr to about 350 mtorr, and a radio frequency power of about 100 W to about 500 W.

In one embodiment, the portion of the gate electrode structure 261 on the second well region 212, the portion of the fin 210 in the second well region 212 and the portion of the semiconductor substrate 200 in the second well region 212 may be removed to form the trench 270 in the dielectric layer 250.

The minimum distance between the sidewall of the trench 270 and the first well region 211 may be about 20 nm to about 1000 nm.

A minimum distance between the bottom of the trench 270 and the bottom of the second well region 212 may be about 20 nm to about 1000 nm.

After forming the trench 270, a path from the doped drain layer to the gate electrode structure 261 may be longer, and it may be required to bypass the trench to reach the gate electrode structure 261. Therefore, the carrier path from the doped drain layer 242 to the gate electrode structure may be increased. When a drain voltage is applied to the doped drain layer, the path of carriers generated by the drain voltage from the second well region to the gate electrode structure may be longer. The longer the path is, the more the neutralized carriers generated by the drain voltage are, so the number of the drain carriers reaching the gate electrode structure may be reduced, and the potential generated by the drain carriers may be reduced, thereby implementing the voltage division of the drain voltage. The position and depth of the trench 270 may determine a size of the isolation layer 271 formed subsequently. By adjusting the position and depth of the trench 270, the path of the carriers generated by the drain voltage from the second well region 212 to the gate electrode structure may be longer. When a withstanding voltage of the gate electrode structure 212 is constant, the longer the path of carriers generated by the drain voltage from the second well region to the gate electrode structure, the higher the voltage division. The drain may withstand higher voltage, so the semiconductor device may withstand the increased voltage.

Figure 9:
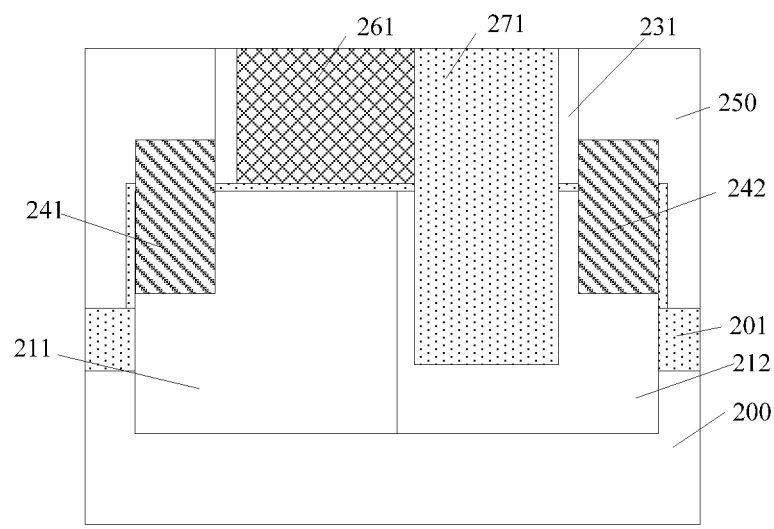
Figure 10:
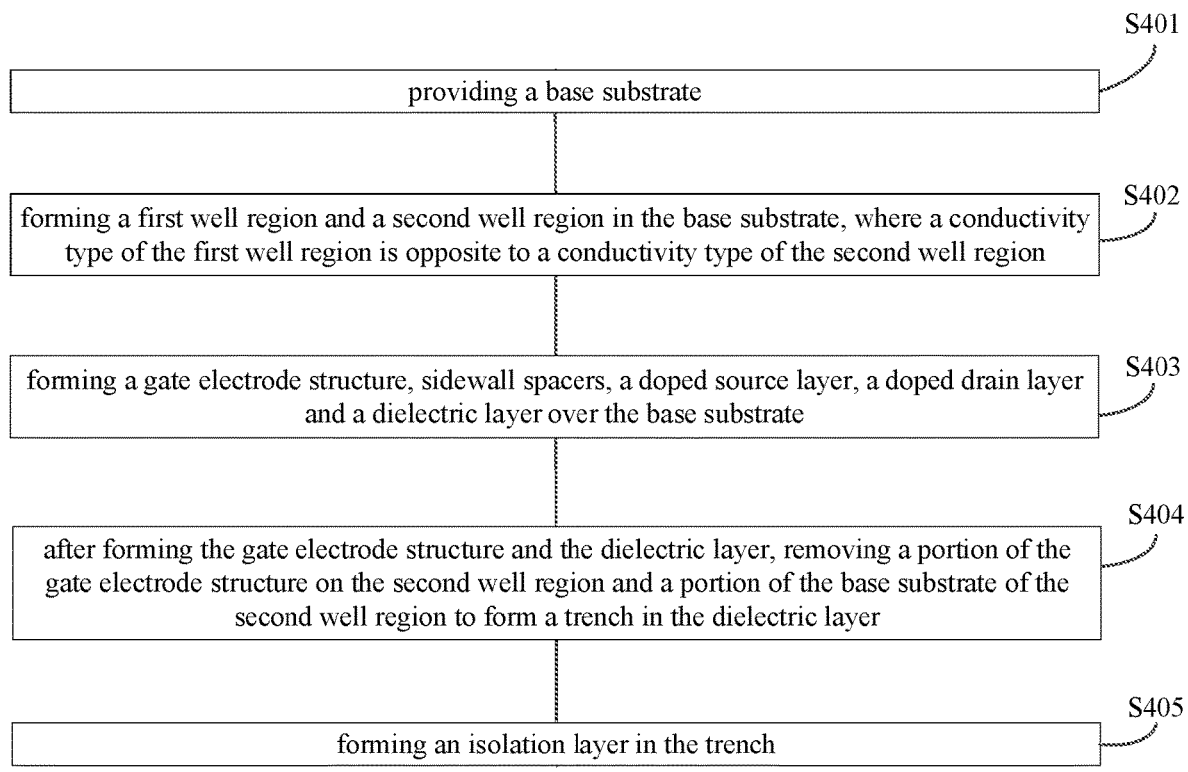
FIG. 10 illustrates a flowchart of an exemplary fabrication method for forming a semiconductor structure according to various disclosed embodiments of the present disclosure.

Referring to FIG. 9, an isolation layer 271 may be formed in the trench 270 (e.g., in S405 of FIG. 10).

The isolation layer 271 may be used to isolate the doped drain layer and the gate electrode structure and increase the carrier path between the doped drain layer and the gate electrode structure.

The isolation layer 271 may be made of a material including silicon oxide, silicon nitride, silicon oxynitride, silicon oxycarbide, silicon carbonitride or silicon oxycarbonitride.

The method for forming the isolation layer 271 may include: forming an initial isolation layer (not shown) in the trench 270 and on the gate electrode structure 261 and on the dielectric layer 250; and planarizing the initial isolation layer till exposing the surfaces of the gate electrode structure 261 and the dielectric layer 250 to form the isolation layer 271 in the trench 270.

The initial isolation layer may be formed by a deposition process such as a fluid chemical vapor deposition process. The fluid chemical vapor deposition process may be used to form the initial isolation layer, which may make the initial isolation layer to have better filling performance.

The isolation layer 271 may be in the gate electrode structure and the base substrate, and the doped source layer 241 and the doped drain layer 242 may be on two sides of the gate electrode structure, so the formed semiconductor device may have a relatively small volume, which may meet the trend of device miniaturization.

Correspondingly, the present disclosure further provides a semiconductor device fabricated by the above-mentioned embodiments. Referring to FIG. 9, the semiconductor device may include: the base substrate, where the first well region 211 and the second well region 212 may be in the base substrate, the first well region 211 may be adjacent to the second well region 212, and the conductivity type of the first well region 211 may be opposite to the conductivity type of the second well region 212; the gate electrode structure 261, the sidewall spacers 231, the doped source layer 241 and the doped drain layer 242 over the base substrate, where the sidewall spacers 231 may cover the sidewalls of the gate electrode structure 261, the doped source layer 241 and the doped drain layer 242 may be respectively on two sides of the gate electrode structure 261 and the sidewall spacers 231, the gate electrode structure 261 and the sidewall spacers 231 may be on the first well region 211 and the second well region 212, the doped source layer 241 may be in the first well region 211, the doped drain layer 242 may be in the second well region 212, and the conductivity type of the doped source layer 241 and the doped drain layer 242 may be opposite to the conductivity type of the second well region 212; the dielectric layer 250 on the base substrate, where the dielectric layer 250 may cover the sidewalls of the sidewall spacers 231, the doped source layer 241 and the doped drain layer 242, and may expose the top surface of the gate electrode structure 261; the trench in the dielectric layer 250, where the trench may be in the gate electrode structure 261 of the second well region 212 and the base substrate of the second well region 212, and expose the sidewalls of the sidewall spacers 231 of the second well region 212; and the isolation layer 271 in the trench.

The materials, structures and positions of the doped source layer 241 and the doped drain layer 242 may refer to the above-mentioned embodiments of the present disclosure, which may not be described in detail.

The material, structure and position of the gate electrode structure 261 may refer to the above-mentioned embodiments of the present disclosure, which may not be described in detail.

The material, structure and position of the isolation layer 271 may refer to the above-mentioned embodiments of the present disclosure, which may not be described in detail.

From the above-mentioned embodiments, it can be seen that the technical solution provided by the present disclosure may achieve at least the following beneficial effects.

In the fabrication method of the semiconductor device provided by the technical solution of the present disclosure, the doped drain layer may be in the second well region, and the isolation layer may be in the second well region and between the gate electrode structure and the doped drain layer. The carrier path from the doped drain layer to the gate electrode structure may need to bypass the isolation layer. When a drain voltage is applied to the doped drain layer, the path of carriers generated by the drain voltage from the second well region to the gate electrode structure may be longer. The longer the path is, the more the neutralized carriers generated by the drain voltage are, so the number of the drain carriers reaching the gate electrode structure may be reduced, and the potential generated by the drain carriers may be reduced, thereby implementing the voltage division of the drain voltage. The depth and width of the trench may determine the thickness and the width of the isolation layer. By adjusting the depth and position of the trench, the path of the carriers generated by the drain voltage from the second well region to the gate electrode structure may be longer. When a withstanding voltage of the gate electrode structure is constant, the longer the path of carriers generated by the drain voltage from the second well region to the gate electrode structure, the higher the voltage division. The drain may withstand a higher voltage, so the semiconductor device may withstand an increased voltage. The trench formed by an etching process may have a relatively large depth, so the thickness of the isolation layer may be larger, the voltage division path may be longer, and the voltage division may be larger, thereby improving the withstanding voltage performance of the semiconductor device. Meanwhile, the isolation layer may be in the gate electrode structure and the base substrate, and the size of the gate electrode structure may be constant; the doped source layer and the doped drain layer may be on two sides of the gate electrode structure, so the formed semiconductor device may have a smaller area to improve device miniaturization.

Although the present disclosure has been disclosed above, the present disclosure is not limited thereto. Any changes and modifications may be made by those skilled in the art without departing from the spirit and scope of the disclosure, and the scope of the disclosure should be determined by the scope defined by the appended claims.

What is claimed is:

1. A semiconductor device, comprising:
a base substrate;
a first well region and a second well region in the base substrate, wherein a conductivity type of the first well region is opposite to a conductivity type of the second well region;
a gate electrode structure, sidewall spacers, a doped source layer and a doped drain layer over the base substrate, wherein:
the sidewall spacers cover sidewalls of the gate electrode structure;
the doped source layer and the doped drain layer are respectively on two sides of the gate electrode structure and the sidewall spacers;
the gate electrode structure and the sidewall spacers are on the first well region and the second well region;
the doped source layer is in the first well region and the doped drain layer is in the second well region; and
a conductivity type of the doped source layer and the doped drain layer is opposite to a conductivity type of the second well region;
a dielectric layer on the base substrate, wherein the dielectric layer covers sidewalls of the sidewall spacers, the doped source layer and the doped drain layer, and exposes a top surface of the gate electrode structure; and
an isolation layer in the dielectric layer, wherein the isolation layer is in the gate electrode structure of the second well region and the base substrate of the second well region, and adjacent to the sidewalls of the sidewall spacer over the second well region.

2. The device according to claim 1, wherein:
the isolation layer is made of a material including silicon oxide, silicon nitride, silicon oxynitride, silicon oxycarbide, silicon carbonitride and silicon oxycarbonitride.

3. The device according to claim 1, wherein:
a minimum distance between a sidewall of the isolation layer and the first well region is about 20 nm to about 1000 nm.

4. The device according to claim 1, wherein:
a minimum distance between a bottom of the isolation layer and a bottom of the second well region is about 20 nm to about 1000 nm.

5. The device according to claim 1, wherein:
a width of the isolation layer along a direction from the doped source layer to the doped drain layer is about 15 nm to 200 nm.

6. The device according to claim 1, wherein:
the base substrate includes a semiconductor substrate and a fin on the semiconductor substrate;
the first well region and the second well region are formed in the fin;
the gate electrode structure crosses the fin;
the sidewall spacers are on the fin;
the doped source layer and the doped drain layer are in the fin; and
the dielectric layer covers a top and sidewalls of the fin.

7. The device according to claim 1, wherein:
the gate electrode structure includes a gate dielectric layer and a gate electrode layer on the gate dielectric layer.

8. The device according to claim 1, wherein:
the first well region has first ions and the second well region has second ions;
a conductivity type of the first ions is opposite to a conductivity type of the second ions;
when the gate electrode structure is used to form a P-type device, the conductivity type of the first ions is N-type and the first ions include phosphorus ions, arsenic ions or antimony ions;
the conductivity type of the second ions is P-type and the second ions include boron ions, $BP^{2-}$ ions or indium ions; and
when the gate electrode structure is used to form a N-type device, the conductivity type of the first ions is P-type and the first ions include boron ions, $Br^{2-}$ ions or indium ions; the conductivity type of the second ions is N-type, and the second ions include phosphorus ions, arsenic ions or antimony ions.

9. The device according to claim 1, wherein:
the doped source layer and the doped drain layer have source/drain ions;
when the gate electrode structure is used to form a P-type device, the doped source layer and the doped drain layer are made of a material including silicon, germanium and silicon germanium; and the source/drain ions are P-type ions and include boron ions, $Br^{2-}$ ions or indium ions; and
when the gate electrode structure is used to form a N-type device, the doped source layer and the doped drain layer are made of a material including silicon, gallium arsenide or indium gallium arsenide; and the source/drain ions are N-type ions and include phosphorus ions, arsenic ions or antimony ions.

* * * * *